US010919762B1

(12) United States Patent
Li et al.

(10) Patent No.: US 10,919,762 B1
(45) Date of Patent: Feb. 16, 2021

(54) METHOD FOR PREPARING AMORPHOUS GEH UNDER HIGH PRESSURE

(71) Applicant: Jilin University, Changchun (CN)

(72) Inventors: Quanjun Li, Changchun (CN); Xiaoling Jing, Changchun (CN); Haiyang Zhao, Changchun (CN); Yi Du, Changchun (CN); Bingbing Liu, Changchun (CN)

(73) Assignee: Jilin University, Changchun (CN)

( * ) Notice: Subject to any disclaimer, the term of this patent is extended or adjusted under 35 U.S.C. 154(b) by 0 days.

(21) Appl. No.: 16/745,566

(22) Filed: Jan. 17, 2020

(30) Foreign Application Priority Data

Dec. 2, 2019 (CN) .......................... 2019 1 1213390

(51) Int. Cl.
*C01B 6/06* (2006.01)
*B01J 3/03* (2006.01)
*B01J 3/06* (2006.01)
*H01L 31/0376* (2006.01)
*H01L 31/18* (2006.01)
*H01L 31/04* (2014.01)

(52) U.S. Cl.
CPC .................................. *C01B 6/06* (2013.01); *B01J 3/03* (2013.01); *B01J 3/062* (2013.01); *B01J 2203/0675* (2013.01); *C01P 2002/70* (2013.01); *C01P 2002/72* (2013.01); *C01P 2004/04* (2013.01); *H01L 31/03762* (2013.01); *H01L 31/04* (2013.01); *H01L 31/1808* (2013.01)

(58) Field of Classification Search
CPC ...... C01B 6/06; B01J 3/062; B01J 3/03; B01J 2203/0675; C01P 2002/70; C01P 2002/72; C01P 2004/04; H01L 31/04; H01L 31/1808; H01L 31/03762
See application file for complete search history.

(56) References Cited

U.S. PATENT DOCUMENTS 4,339,252 A * 7/1982 Bell .......................... B01J 3/06
425/DIG. 26

OTHER PUBLICATIONS

Ashcroft "Hydrogen Dominant Metallic Alloys: High Temperature Superconductors?" Physical Review Letters vol. 92, No. 18 (Year: 2004).*

(Continued)

*Primary Examiner* — Anthony J Zimmer
*Assistant Examiner* — Syed T Iqbal
(74) *Attorney, Agent, or Firm* — Troutman Pepper Hamilton Sanders LLP; Christopher C. Close, Jr.

(57) ABSTRACT

The present invention provides a preparation method of amorphous GeH, and belongs to the field of preparation technologies of amorphous GeH. The preparation method provided in the present invention includes the following step: sealing crystalline GeH, a pressure calibration object, and a pressure transmitting medium in a cavity of a diamond anvil cell, and adjusting pressure in the cavity to obtain amorphous GeH. In the present invention, pressure is applied to the GeH in the sealed diamond anvil cell, to implement amorphization of the GeH at room temperature. In this way, impurities can hardly be found in the preparation method, and pure amorphous GeH can be obtained. In addition, the method provided in the present invention has simple operations and good repeatability.

7 Claims, 3 Drawing Sheets

(56) References Cited

OTHER PUBLICATIONS

Strobel et al. "Vibrational dynamics, intermolecular interactions, and compound formation in GeH4—H2 under pressure", The Journal of Chemical Physics 133, 164512 2010 (Year: 2010).*
Imai "Pressure—Included Phase Transition of Crystalline and Amorphous Silicon and Germanium at Low Temperatures", High Pressure Research, 1996, vol. 15, pp. 167-189 (Year: 1996).*
Bianco et al. "Stability and Exfoliation of Germanane: A Germanium Graphane Analogue" ACS Nano 2013, 7, 5, 4414-4421 (Year: 2013).*

* cited by examiner

METHOD FOR PREPARING AMORPHOUS GEH UNDER HIGH PRESSURE

TECHNICAL FIELD

The present invention belongs to the technical field of amorphous GeH preparation, and in particular, to a method for preparing amorphous GeH under high pressure.

BACKGROUND

Currently, most electronic devices use substrates made of monocrystalline semiconductors, especially monocrystalline silicon. However, monocrystalline silicon has two obvious disadvantages: 1. A process from growth of monocrystalline silicon, wafer cutting, grinding, polishing, to device fabrication is rather complex with a relatively large loss. 2. It is difficult to fabricate a large-area device using a silicon wafer with a small diameter. Amorphous semiconductors can well resolve the problems mentioned above.

Currently, amorphous semiconductors most studied are classified into two types: amorphous chalcogenide semiconductors and group IV elemental semiconductors (for example, noncrystalline silicon). Amorphous silicon is most widely applied in amorphous silicon solar cells currently. Compared with a crystalline silicon solar cell, an amorphous silicon solar cell features a low raw material loss, simple fabrication process, and low costs. Moreover, as a material used for a solar cell, amorphous GeH can effectively improve the conversion efficiency of the solar cell.

In a conventional method for synthesizing amorphous GeH, usually, GeH is heated for amorphization at 75-175° C. for more than 4 h in the atmosphere of argon gas, and is naturally cooled to room temperature to obtain an amorphous GeH sample. However, this method is time-consuming and costly, and is neither energy saving nor environmentally friendly. In addition, due to the use of some impure argon gas, it is prone to introduce impurities in the preparation method of the amorphous GeH.

SUMMARY

In view of this, an objective of the present invention is to provide a preparation method of amorphous GeH. The preparation method provided in the present invention has low time consumption, and can implement amorphization of GeH at room temperature. In addition, impurities can hardly be found in the preparation method of amorphous GeH.

To achieve the foregoing objective, the present invention provides the technical solution as follows:

The present invention provides a method for preparing amorphous GeH under high pressure, including the following step:

sealing crystalline GeH, a pressure calibration object, and a pressure transmitting medium in a cavity of a diamond anvil cell, and adjusting pressure in the cavity to obtain amorphous GeH.

Preferably, the adjusting pressure in the cavity is implemented by adjusting a press bolt of the diamond anvil cell.

Preferably, a pressurization rate of the press bolt is 0.2-0.5 GPa/min.

Preferably, the pressure is 0.5-40 GPa.

Preferably, a diameter of a diamond anvil face of the diamond anvil cell is 300-400 μm. Preferably, the cavity of the diamond anvil cell has a diameter of 130-150 μm and a height of 40-60 μm.

Preferably, a gasket of the diamond anvil cell is a T301 steel sheet.

Preferably, the preparation method further includes in-situ tests of X-ray diffraction and amorphization of GeH.

The present invention provides a method for preparing amorphous GeH under high pressure, including the following step: sealing crystalline GeH, a pressure calibration object, and a pressure transmitting medium in a cavity of a diamond anvil cell, and adjusting pressure in the cavity to obtain amorphous GeH. In the present invention, pressure is applied to the crystalline GeH in the sealed diamond anvil cell, to implement amorphization of the crystalline GeH at room temperature. In this way, the preparation cycle is short; impurities can hardly be found in the prepared amorphous GeH; and pure amorphous GeH can be obtained. Therefore, the problem existing in prior art can be effectively resolved. In addition, the method provided in the present invention has simple operations and good repeatability.

DETAILED DESCRIPTION

Figure 1:
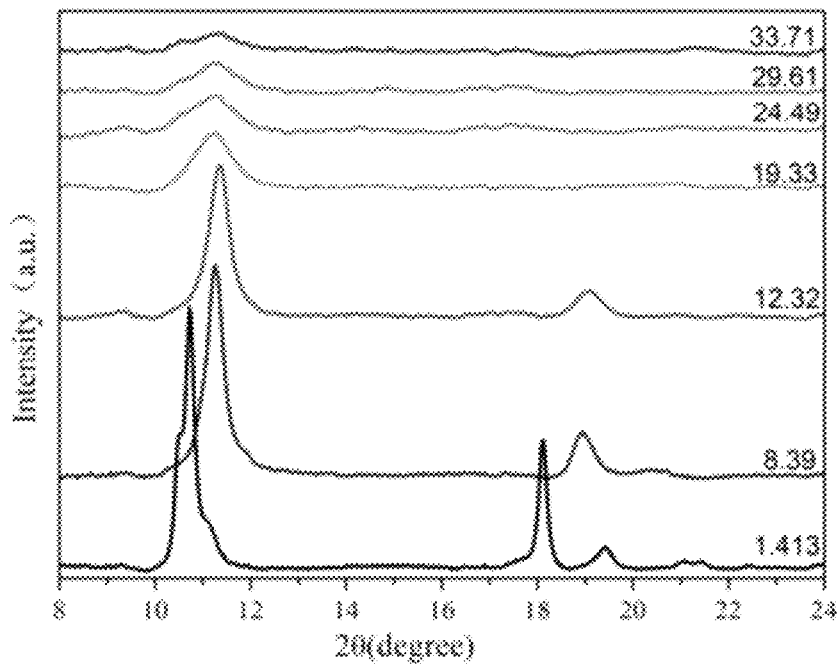
FIG. 1 is X-ray diffraction patterns of a GeH sample under different pressure.

The present invention provides a method for preparing amorphous GeH under high pressure, including the following step:

sealing crystalline GeH, a pressure calibration object, and a pressure transmitting medium in a cavity of a diamond anvil cell, and adjusting pressure in the cavity to obtain amorphous GeH. In the present invention, the pressure calibration object is preferably ruby; a particle size of the ruby is preferably 10-20 μm; 1-2 rubies are preferably used; and the ruby is preferably placed at the edge of the cavity. In the present invention, a particle size of the crystalline GeH is preferably 100-110 μm, and the crystalline GeH is preferably placed at the center of the cavity. A dosage of the crystalline GeH is not specifically limited in the present invention, as long as the crystalline GeH can fully fill the cavity of the diamond anvil cell. In the present invention, the pressure transmitting medium is preferably silicone oil, and 1 drop of the silicone oil is preferably used.

In the present invention, the diamond anvil cell is preferably a symmetric diamond anvil cell (DAC). In the present invention, a diameter of a diamond anvil face of the diamond anvil cell is preferably 300-400 μm. For the cavity of the diamond anvil cell, a diameter is preferably 130-150 μm, a height is preferably 40-60 μm, and a center is preferably obtained by laser drilling. A gasket of the diamond anvil cell is preferably a T301 steel sheet. In the present invention, the T301 steel sheet is used as a gasket, and can generate hydrostatic pressure and protect diamond when a raw material is filled in the cavity. In the present invention, a diamond anvil face with a specific area can generate relatively high pressure in the cavity. The operation of the diamond anvil cell is not specifically limited in the present invention, as long as an operation mode well known by a person skilled in the art is implemented.

In the present invention, the adjusting pressure in the cavity is preferably implemented by adjusting a press bolt of the diamond anvil cell. A pressurization rate of the press bolt is preferably 0.2-0.5 GPa/min, further preferably 0.2-0.4 GPa/min, and more preferably 0.2 GPa/min. In the present invention, pressure is applied uniformly and slowly to the cavity of the diamond anvil cell at a specific pressurization rate. As a pressure transmitting medium, silicone oil uniformly transmits the applied pressure to the crystalline GeH, to implement amorphization of the amorphous GeH at room temperature. Moreover, the process is conducted in a sealing condition, and impurities can hardly be found in the prepared amorphous GeH.

In the present invention, the pressure is preferably 0.5-40 GPa and further preferably 0.5-35 GPa. In the present invention, preferably, after initial pressure of 0.5-1 GPa is applied to the cavity of the diamond anvil cell, the press bolt of the diamond anvil cell is rotated to uniformly apply pressure to the pressure cavity. In the present invention, the initial pressure of 0.5-1 GPa is applied to the cavity of the diamond anvil cell to increase viscosity of the silicone oil, to fully cure the silicone oil and fully seal the crystalline GeH, ruby, and silicone oil in the cavity of the diamond anvil cell.

The present invention further includes in-situ tests of X-ray diffraction and amorphization of GeH. In the present invention, online testing of X-ray diffraction and amorphization of GeH can be implemented by in-situ tests of an X-ray diffraction pattern of GeH during amorphization and a fluorescence pattern of the ruby when pressure changes.

The preparation method of amorphous GeH provided in the present invention is described in detail below with reference to the embodiments, but the embodiments should not be construed as limiting the protection scope of the present invention.

Embodiment 1

First, a ruby is placed on two clean diamond anvil faces, where a particle size of the ruby is 10 μm, and the two anvil faces are respectively formed by diamond with a diameter of 400 μm. A large piece of crystalline GeH sample is placed in a stainless steel sample chamber with a diameter of 150 μm and a thickness of 50 μm, where a particle size of the crystalline GeH sample is 100 μm. The ruby is placed at the edge of the sample chamber, and the sample overspreads the center of the sample chamber.

After the sample and the ruby are loaded, a drop of silicone oil is dropped into the sample chamber as a pressure transmitting medium; and a diamond anvil cell is closed and a press bolt is reset. The press bolt is adjusted to an initial position, and slowly rotated to apply initial pressure of 0.5 GPa, to fully seal the crystalline GeH sample, ruby, and silicone oil in a pressure cavity, and fully cure the silicone oil as a pressure transmitting medium. Pressure in the pressure cavity of the diamond anvil cell is calibrated by using the ruby.

Pressure is applied to the sample in the pressure cavity of the diamond anvil cell at a specific pressurization rate of 0.2 GPa/min. Pressurization is stopped when the pressure in the cavity of the diamond anvil cell reaches 33.7 GPa. After the pressure is relieved to atmospheric pressure, an amorphous GeH sample is obtained.

In this embodiment, in-situ tests are conducted on an X-ray diffraction pattern of the GeH sample in the cavity of the diamond anvil cell and a fluorescence pattern of the ruby in the cavity when pressure changes. As the pressure in the cavity increases, an X-ray diffraction pattern of the GeH sample and a fluorescence pattern of the ruby when pressure changes are recorded for online testing of X-ray diffraction and amorphization of GeH.

FIG. 1 is X-ray diffraction patterns of the GeH sample under different pressure. It can be seen from the figure that, initial pressure is 1 GPa. When pressure applied to the sample by rotating the press bolt is 19.33 GPa, amorphization of the GeH sample can be observed from the X-ray diffraction pattern. The intensity of a diffraction peak decreases at approximately 11° and the diffraction peak starts to be broadened. As the pressure further increases, a long-range order of the GeH sample is damaged; the GeH sample starts to be transformed to an amorphous state; and the GeH sample is still in the amorphous state at 33.7 GPa.

Figure 2:
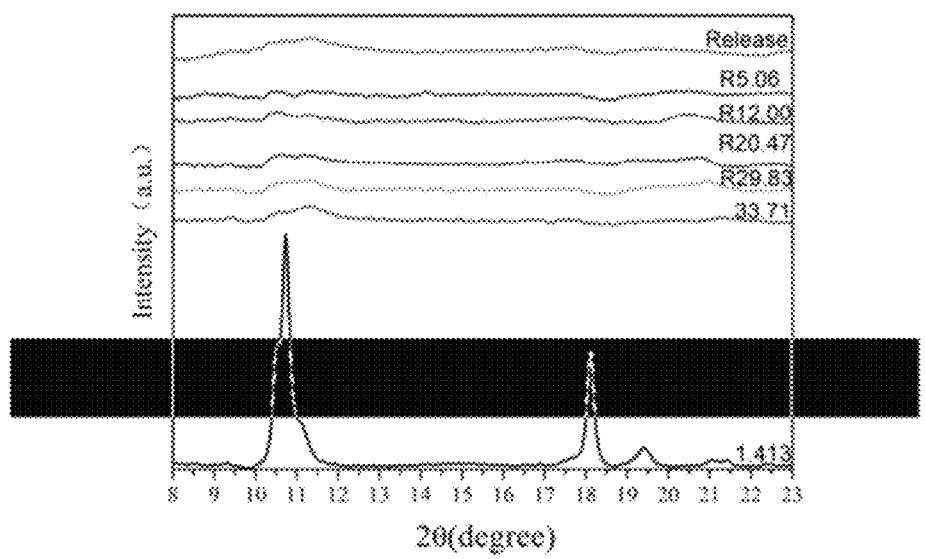
FIG. 2 is X-ray diffraction patterns, obtained during pressure relief, of amorphous GeH prepared in Embodiment 1.

FIG. 2 is X-ray diffraction patterns, obtained during pressure relief, of the amorphous GeH prepared in Embodiment 1. It can be seen from the figure that, a diffraction peak of the amorphous GeH after the pressure is relieved to atmospheric pressure is still greatly broadened, and has very low intensity. This proves that there is a short-range order for the sample after the pressure is relieved to the atmospheric pressure and the sample is still kept in a good amorphous state.

Figure 3:
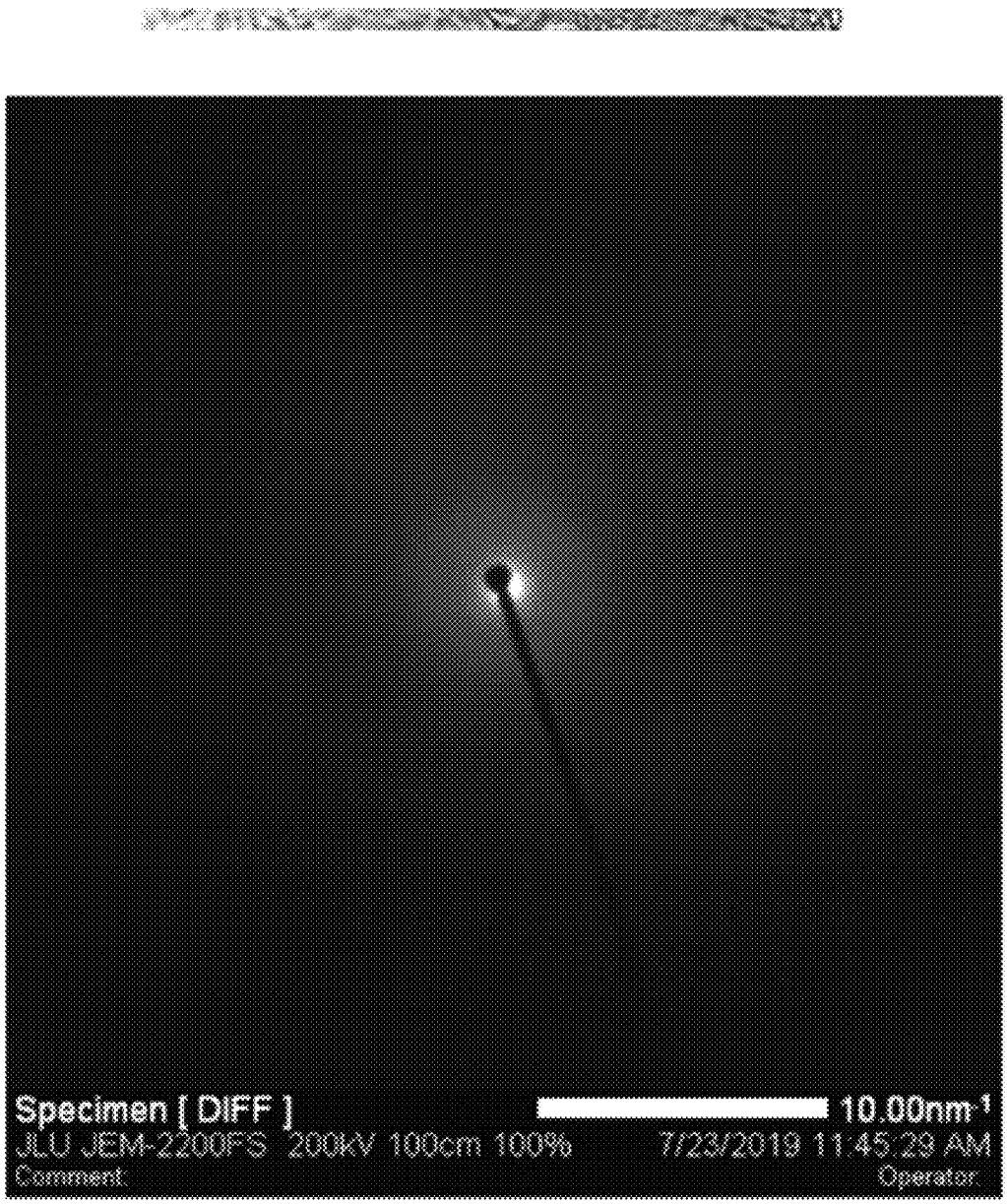
FIG. 3 is a selected area electron diffraction pattern of amorphous GeH prepared in Embodiment 1.

FIG. 3 is a selected area electron diffraction pattern of the amorphous GeH prepared in Embodiment 1. It can be seen from the figure that, there is only one diffuse center spot in the electron diffraction pattern of the GeH sample after pressure relief. This further verifies that the method can be used to prepare an amorphous GeH sample.

Figure 4:
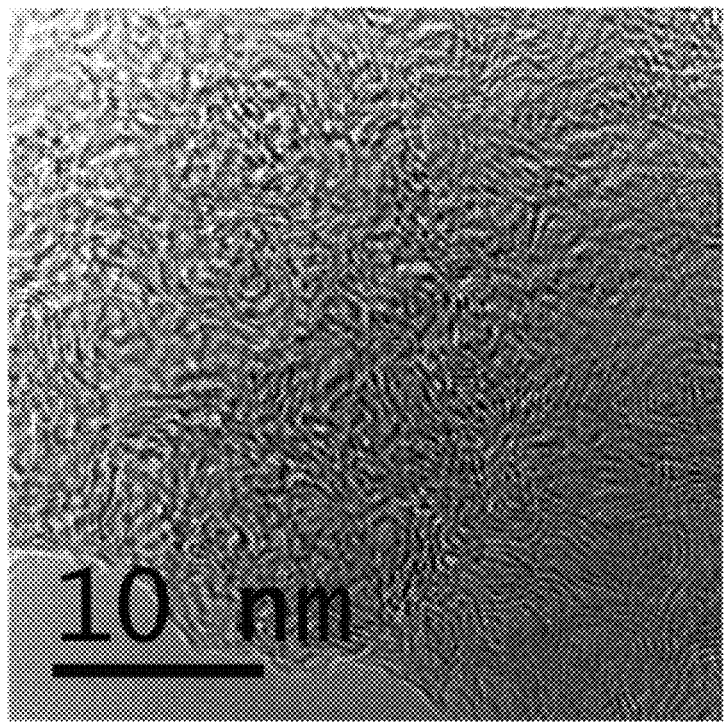
FIG. 4 is a high-resolution transmission electron microscopy image of amorphous GeH prepared in Embodiment 1.

FIG. 4 is a high-resolution transmission electron microscopy image of the amorphous GeH prepared in Embodiment 1. It can be seen from the figure that, compared with the regular lattice arrangement of the GeH sample before pressurization, the lattice arrangement of the GeH sample after pressurization becomes disorderly and unsystematic, and there is no regular lattice structure. Compared with the GeH sample before pressurization, the GeH sample after pressure relief is in an irreversible amorphous state.

Embodiment 2

First, a ruby is placed on two clean diamond anvil faces, where a particle size of the ruby is 20 μm, and the two anvil faces are respectively formed by diamond with a diameter of 400 μm. A large piece of crystalline GeH sample is placed in a stainless steel sample chamber with a diameter of 130 μm and a thickness of 40 μm, where a particle size of the crystalline GeH sample is 110 μm. The ruby is placed at the edge of the sample chamber, and the sample overspreads the center of the sample chamber.

After the sample and the ruby are loaded, a drop of silicone oil is dropped into the sample chamber as a pressure transmitting medium; and a diamond anvil cell is closed and a press bolt is reset. The press bolt is adjusted to an initial position, and the press bolt is slowly rotated to apply initial pressure of 1 GPa, to fully seal the crystalline GeH sample, ruby, and silicone oil in a pressure cavity, and fully cure the silicone oil as a pressure transmitting medium. Pressure in the pressure cavity of the diamond anvil cell is calibrated by using the ruby.

Pressure is applied to the sample in the cavity of the diamond anvil cell at a pressurization rate of 0.5 GPa/min.

Pressurization is stopped when the pressure in the cavity of the diamond anvil cell reaches 33 GPa. After the pressure is relieved to atmospheric pressure, an amorphous GeH sample is obtained.

Figure 5:
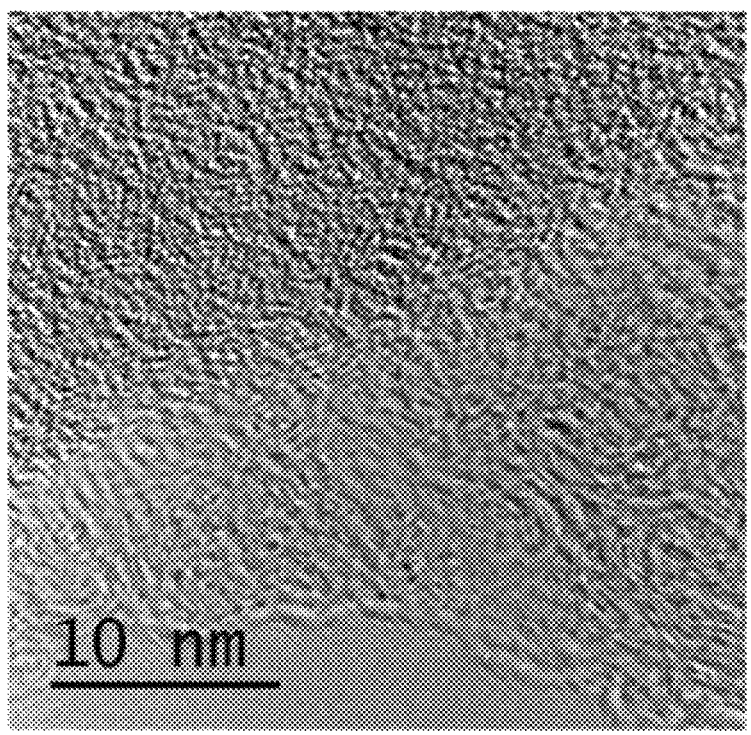
FIG. 5 is a high-resolution transmission electron microscopy image of amorphous GeH prepared in Embodiment 2.

FIG. 5 is a high-resolution transmission electron microscopy image of the amorphous GeH sample obtained after pressure is relieved to atmospheric pressure in Embodiment 2. It can be seen from the figure that, the prepared amorphous GeH sample has no regular lattice arrangement and no lattice structure. Compared with the sample before pressurization, the GeH sample after pressure relief is in an irreversible amorphous state. This also indicates that the preparation method provided in the present invention has good repeatability.

In conclusion, in the present invention, pressure of 19.33 GPa or higher is applied to a GeH sample by using the diamond anvil cell, to implement amorphization of the crystalline GeH sample. The GeH sample after pressure relief is in an irreversible amorphous state. In this way, an amorphous GeH sample can be obtained at room temperature. In addition, the obtained amorphous sample has high purity; the operations are safe; and the amorphous GeH sample can be rapidly obtained.

The foregoing descriptions are merely preferred implementations of the present invention. It should be noted that for a person of ordinary skill in the art, several improvements and modifications may further be made without departing from the principle of the present invention. These improvements and modifications should also be deemed as falling within the protection scope of the present invention.

What is claimed is:

1. A method for preparing amorphous GeH under high pressure, comprising the following step:
    sealing crystalline GeH, a pressure calibration object, and a pressure transmitting medium in a cavity of a diamond anvil cell, and increasing a pressure in the cavity at a pressurization rate of 0.2-0.5 GPa/min to 19.33-40 GPa to obtain amorphous GeH at room temperature.

2. The preparation method according to claim 1, wherein increasing the pressure in the cavity is implemented by adjusting a press bolt of the diamond anvil cell.

3. The preparation method according to claim 1, wherein a diameter of a diamond anvil face of the diamond anvil cell is 300-400 μm.

4. The preparation method according to claim 1, wherein the cavity of the diamond anvil cell has a diameter of 130-150 μm and a height of 40-60 μm.

5. The preparation method according to claim 1, wherein a gasket of the diamond anvil cell is a T301 steel sheet.

6. The preparation method according to claim 1, wherein the preparation method further comprises in-situ tests of X-ray diffraction of GeH and amorphization of GeH.

7. The preparation method according to claim 1, wherein the crystalline GeH has a particle size of 100-110 μm.

* * * * *